US012700834B2

(12) United States Patent
Su et al.

(10) Patent No.: US 12,700,834 B2
(45) Date of Patent: Aug. 4, 2026

(54) PHASE COMPENSATION CIRCUIT MODULE, POWER AMPLIFICATION ASSEMBLY, AND COMPENSATION METHOD AND DEVICE

(71) Applicant: SMARTER MICROELECTRONICS (GUANG ZHOU) CO., LTD., Guangzhou (CN)

(72) Inventors: Qiang Su, Guangzhou (CN); Zhenfei Peng, Guangzhou (CN); Baiming Xu, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 750 days.

(21) Appl. No.: 18/063,663

(22) Filed: Dec. 8, 2022

(65) Prior Publication Data

US 2023/0105816 A1 Apr. 6, 2023

Related U.S. Application Data

(63) Continuation of application No. PCT/CN2022/116371, filed on Aug. 31, 2022.

(30) Foreign Application Priority Data

Aug. 31, 2021 (CN) .......................... 202111014304.X

(51) Int. Cl.
*H03G 3/20* (2006.01)
*H03F 1/22* (2006.01)
(Continued)

(52) U.S. Cl.
CPC ............... *H03F 1/32* (2013.01); *H03F 1/565* (2013.01); *H03F 3/21* (2013.01); *H03F 1/223* (2013.01); *H03F 2200/222* (2013.01)

(58) Field of Classification Search
CPC ...... H03F 1/22; H03F 1/223; H03F 2200/294; H03F 3/20; H03F 1/0222; H03F 2200/102; H03G 3/3042
(Continued)

(56) References Cited

U.S. PATENT DOCUMENTS 8,089,313 B2 * 1/2012 Chang ................... H03F 1/0266
330/136
8,643,434 B2 * 2/2014 Zhu .......................... H03G 1/04
330/136
(Continued)

FOREIGN PATENT DOCUMENTS

CN 112187192 A * 1/2021 ............. H03F 1/301
CN 113746438 * 3/2021 ........... H03F 1/3205
CN 113746438 A * 12/2021 ............. H03F 1/342

*Primary Examiner* — Khanh V Nguyen
(74) *Attorney, Agent, or Firm* — Syncoda LLC; Feng Ma

(57) ABSTRACT

A phase compensation circuit module includes at least a variable resistor, a detection component and a control component. The detection component has a detection end connected with a signal input end of a power amplifier, and is configured to detect an input signal of the signal input end. The control component is connected with the detection component, and is configured to output a control signal according to the input signal detected by the detection component. The variable resistor is connected with an output end of the control component, and is configured to change resistance linked to the power amplifier according to the control signal, the variable resistor constitutes a loop of the power amplifier and is configured to form on-resistance of a transistor of the power amplifier. The on-resistance of the transistor is configured to change as a phase of an output signal of the power amplifier changes.

19 Claims, 18 Drawing Sheets

Whole circuit

(51) Int. Cl.
*H03F 1/32* (2006.01)
*H03F 1/56* (2006.01)
*H03F 3/21* (2006.01)

(58) Field of Classification Search
USPC .................................................. 330/136, 311
See application file for complete search history.

(56) References Cited

U.S. PATENT DOCUMENTS

| | | | | |
|---|---|---|---|---|
| 9,041,473 B2 * | 5/2015 | Fujiwara | ................. | H03F 1/223 |
| | | | | 330/311 |
| 2014/0139291 A1 * | 5/2014 | Won | .......................... | H03F 3/21 |
| | | | | 330/296 |
| 2014/0306761 A1 * | 10/2014 | Fujiwara | ................. | H03F 1/223 |
| | | | | 330/277 |

* cited by examiner

Comparison diagram of equivalent resistance of stepping circuit

| Number | CTRL_S <3> | CTRL_S <2> | CTRL_S <1> | CTRL_S <0> | Equivalent resistance Req |
|--------|------------|------------|------------|------------|---------------------------|
| 1 | 1 | 1 | 1 | 1 | 0 |
| 2 | 0 | 1 | 1 | 1 | R1 |
| 3 | 0 | 0 | 1 | 1 | R1+R2 |
| 4 | 0 | 0 | 0 | 1 | R1+R2+R3 |
| … | … | … | … | … | … |
| 5 | 0 | 0 | 0 | 0 | R1+R2+R3+R4 |

PHASE COMPENSATION CIRCUIT MODULE, POWER AMPLIFICATION ASSEMBLY, AND COMPENSATION METHOD AND DEVICE

CROSS-REFERENCE TO RELATED APPLICATIONS

This is a continuation application of International Patent Application No. PCT/CN2022/116371 filed on Aug. 31, 2022, which claims priority to Chinese Patent Application No. 202111014304.X filed on Aug. 31, 2021. The disclosures of the above-referenced applications are hereby incorporated by reference in their entirety.

BACKGROUND

In a power amplifier, Amplitude Modulation to Phase Modulation (AM-PM) may characterize a linearity index of the power amplifier. AM-PM distortion refers to change of phase difference between an input signal and an output signal due to amplitude change of the signals, after the input signal enters the power amplifier. Due to existence of nonlinearity of the amplifier itself, nonlinearity of a transistor is increased with the increase of the input signal, which further deteriorates AM-PM, and then affects the overall linearity.

An AM-PM compensation circuit or device is implemented by a phase mutual compensation circuit with a two-stage amplification transistor. However, the phase mutual compensation circuit has poor adjustable performance as a whole and is difficult to cope with complex change of AM-PM. Therefore, a phase compensation circuit or device which has good adjustable performance and may cope with complex change of AM-PM is needed.

SUMMARY

The disclosure relates to the technical field of electronics, and in particular to a phase compensation circuit module, a power amplification assembly, and a compensation method and device.

The disclosure provides a phase compensation circuit module, a power amplification assembly, and a compensation method and device.

According to a first aspect of the disclosure, there is provided a phase compensation circuit module, including at least a variable resistor, a detection component and a control component. The detection component has a detection end connected with a signal input end of a power amplifier, and is configured to detect an input signal of the signal input end. The control component is connected with the detection component, and is configured to output a control signal according to the input signal detected by the detection component. The variable resistor is connected with an output end of the control component, and is configured to change resistance linked to the power amplifier according to the control signal, the variable resistor forms a loop of the power amplifier and is configured to form on-resistance of a transistor of the power amplifier. The on-resistance of the transistor is configured to decrease in response to a phase of an output signal of the power amplifier decreasing and increase in response to the phase of the output signal of the power amplifier increasing. The increased or decreased on-resistance is configured to make a change curve of AM-PM of the output signal changed from an arc segment to a straight segment.

According to a second aspect of the disclosure, there is provided a power amplification assembly, including a power amplifier and the phase compensation circuit module described in the first aspect. The power amplifier includes at least a signal input end, a signal output end, a transistor arranged between the signal input end and the signal output end, and a capacitor connected with the transistor. The variable resistor has a first end connected with the capacitor and a second end connected with the transistor, and is configured to form a loop of the power amplifier and form on-resistance of the transistor of the power amplifier. The on-resistance of the transistor is configured to decrease in response to a phase of an output signal of the power amplifier decreasing and increase in response to the phase of the output signal of the power amplifier increasing. The increased or decreased on-resistance is configured to make a change curve of AM-PM of the output signal changed from an arc segment to a straight segment.

According to a third aspect of the disclosure, there is provided a compensation method, compensating the phase of the output signal of the power amplifier provided in the second aspect by using the phase compensation circuit module, and including the following operations. The input signal of the signal input end is detected by the detection component. The control signal is output by the control component, according to the input signal detected by the detection component, here the control signal is configured to change resistance linked to the power amplifier, and the variable resistor forms a loop of the power amplifier and is configured to form on-resistance of the transistor of the power amplifier. The on-resistance of the transistor is configured to decrease in response to a phase of an output signal of the power amplifier decreasing and increase in response to the phase of the output signal of the power amplifier increasing. The increased or decreased on-resistance is configured to make a change curve of AM-PM of the output signal changed from an arc segment to a straight segment.

According to a fourth aspect of the disclosure, there is provided a compensation device, including a memory and a processor. The processor is connected with the memory, and is configured to implement operations of the supplementary method described in the third aspect, through computer-executable instructions of the memory.

Technical solutions provided in the embodiments of the disclosure may include beneficial effects as follows. The phase compensation circuit module provided by the embodiments of the disclosure may include at least a variable resistor, a detection component and a control component. The detection component has a detection end connected with a signal input end of a power amplifier and detects an input signal of the signal input end. The control component is connected with the detection component and outputs a control signal according to the detected input signal. The variable resistor is connected with an output end of the control component and changes resistance linked to the power amplifier according to the control signal, the variable resistor forms a loop of the power amplifier and is configured to form on-resistance of a transistor of the power amplifier. The on-resistance of the transistor is configured to decrease in response to a phase of an output signal of the power amplifier decreasing and increase in response to the phase of the output signal of the power amplifier increasing. The increased or decreased on-resistance is configured to make a change curve of AM-PM of the output signal changed from an arc segment to a straight segment. Compared with a simple phase compensation circuit with a two-stage transistor, since the detection component and the control component are added, the control signal output by the control component may increase or decrease according to the input signal and change of the phase of the output signal, and then the variable resistor may increase or decrease according to the control signal. Therefore, the phase compensation circuit module provided by the embodiments of the disclosure has an effect of keeping a change curve of the phase of the output signal showing an arc of an increasing or decreasing trend to be a straight segment, and then improves stability of AM-PM and linearity of the power amplifier, has good adjustability, and may cope with complex change of AM-PM.

It may be understood that the above general descriptions and detailed descriptions below are only exemplary and explanatory and are not intended to limit the disclosure. Other features of the embodiments of the disclosure will become apparent by describing exemplary embodiments in detail below with reference to the drawings.

BRIEF DESCRIPTION OF THE DRAWINGS

The drawings are incorporated in the specification and form a part of the specification, illustrate embodiments consistent with the disclosure, and serve to explain the technical solutions of the disclosure together with the specification.

4

Figure 15:
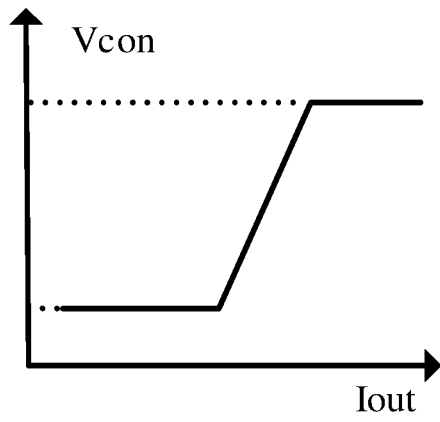

FIG. 15 is a schematic diagram of a relationship curve between a control voltage Vcon output by a control component of a phase compensation circuit module and an input signal Iout according to an exemplary embodiment.

FIG. 16 is a comparison diagram of equivalent resistance of a stepping circuit in a control component of a phase compensation circuit module according to an exemplary embodiment.

Figure 17:
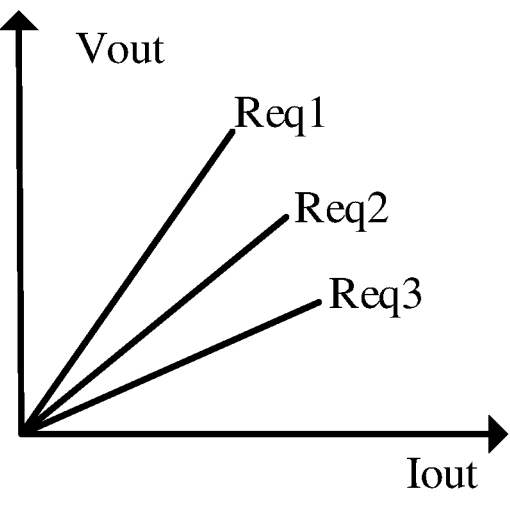

FIG. 17 is a schematic diagram of a relationship curve between an output voltage Vout and an input signal Iout under an action of equivalent resistance Req of a control circuit according to an exemplary embodiment.

Figure 18:
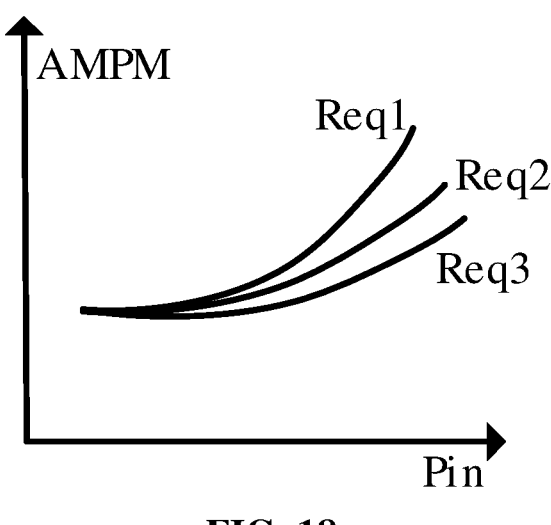

FIG. 18 is a schematic diagram of a relationship curve between AM-PM and an input signal Iout under an action of equivalent resistance Req of a control circuit according to an exemplary embodiment.

DETAILED DESCRIPTION

Exemplary embodiments, features and aspects of the disclosure will be described in detail below with reference to the drawings. The same reference numbers in the drawings represent components with the same or similar functions. Although aspects of the embodiments are shown in the drawings, the drawings are not required to be drawn to scale, unless specified otherwise.

Here a special word "exemplary" means "as an example, an embodiment or illustration". Here it is unnecessary to interpret any embodiment described as "exemplary" as being superior to or better than other embodiments.

A term "and/or" in the disclosure is only an association relationship for describing associated objects and represents that three relationships may exist. For example, A and/or B may represent three conditions: i.e., independent existence of A, existence of both A and B, and independent existence of B. Furthermore, a term "at least one" in the disclosure represents any one of multiple items or any combination of at least two of multiple items. For example, inclusion of at least one of A, B or C may represent inclusion of any one or more elements selected from a set formed of A, B and C.

Furthermore, many specific details are given in the following specific implementations, to describe the embodiments of the disclosure better. It may be understood by those skilled in the art that the embodiments of the disclosure may still be implemented even without some specific details. In some embodiments, methods, means, components and circuits well known to those skilled in the art are not described in detail, to highlight subject matters of the embodiments of the disclosure.

Figure 1:
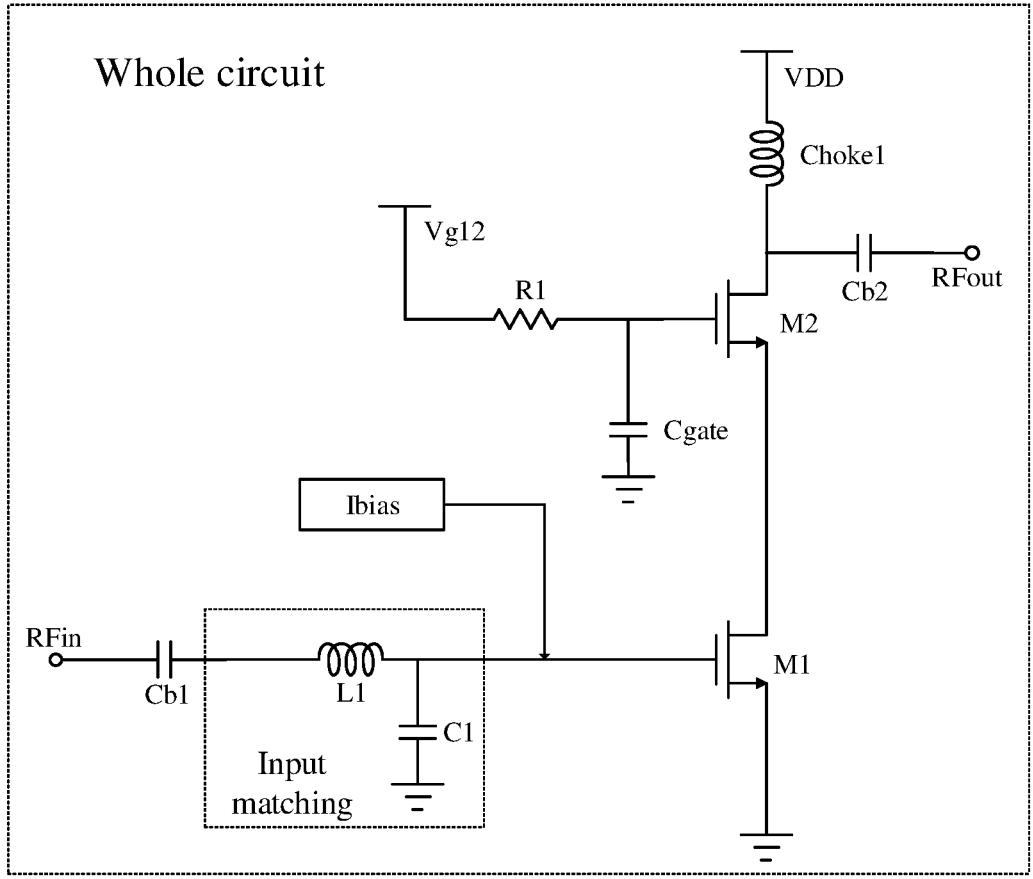
FIG. 1 is a schematic structural diagram of a power amplifier according to an embodiment.
Figure 2:
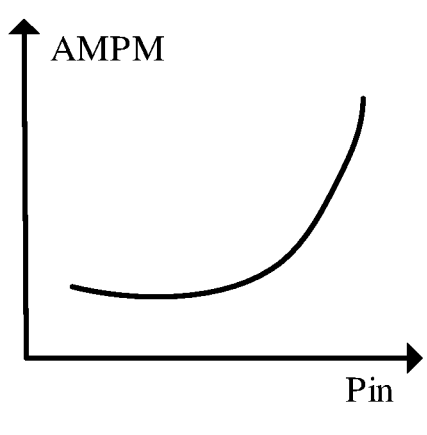
FIG. 2 is a schematic diagram of a change curve of AM-PM distortion according to an embodiment.
Figure 3:
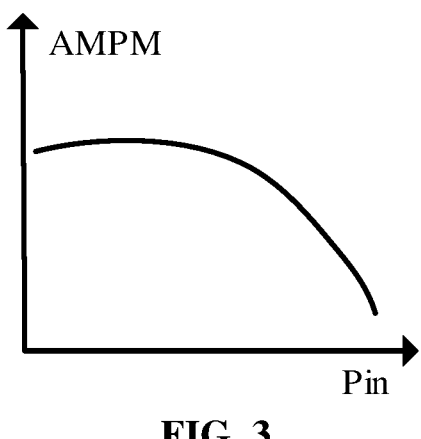
FIG. 3 is a schematic diagram of a change curve of AM-PM distortion according to an embodiment.

FIG. 1 shows a power amplifier according to an embodiment. RFin and RFout are an input node and an output node, respectively. In the amplifier circuit, a stacked two-layer amplification transistor formed of M1 and M2, Ibias and Vg12 form a bias network. VDD provides a Direct Current (DC) feeding network which is connected to a drain of the transistor through a choke coil Choke1. Cb1 and Cb2 are blocking capacitors of input and output, respectively. L1 and C1 form an output matching network. With the increase of an input signal, nonlinearity of the power amplifier is enhanced, and distortion of the amplifier deteriorates. AM-PM distortion thereof has two change trends. As shown in FIG. 2, AM-PM curve may show an ascending trend with the increase of input power. As shown in FIG. 3, AM-PM curve may also show a descending trend with the increase of input power. Without compensating the trend of AM-PM, a linearity index of the circuit may further deteriorate and cannot meet index requirements. A phase compensation method by means of anterior and posterior two-stage power amplifiers has poor adjustable performance as a whole and is difficult to cope with complex change of AM-PM.

Figure 4:
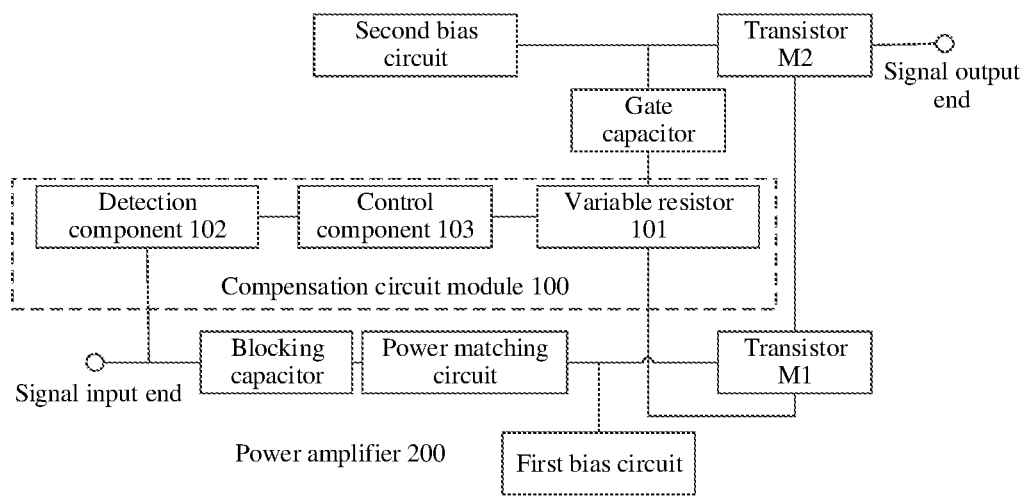
FIG. 4 is a schematic structural diagram of a phase compensation circuit module and a power amplifier according to an exemplary embodiment.
Figure 5:
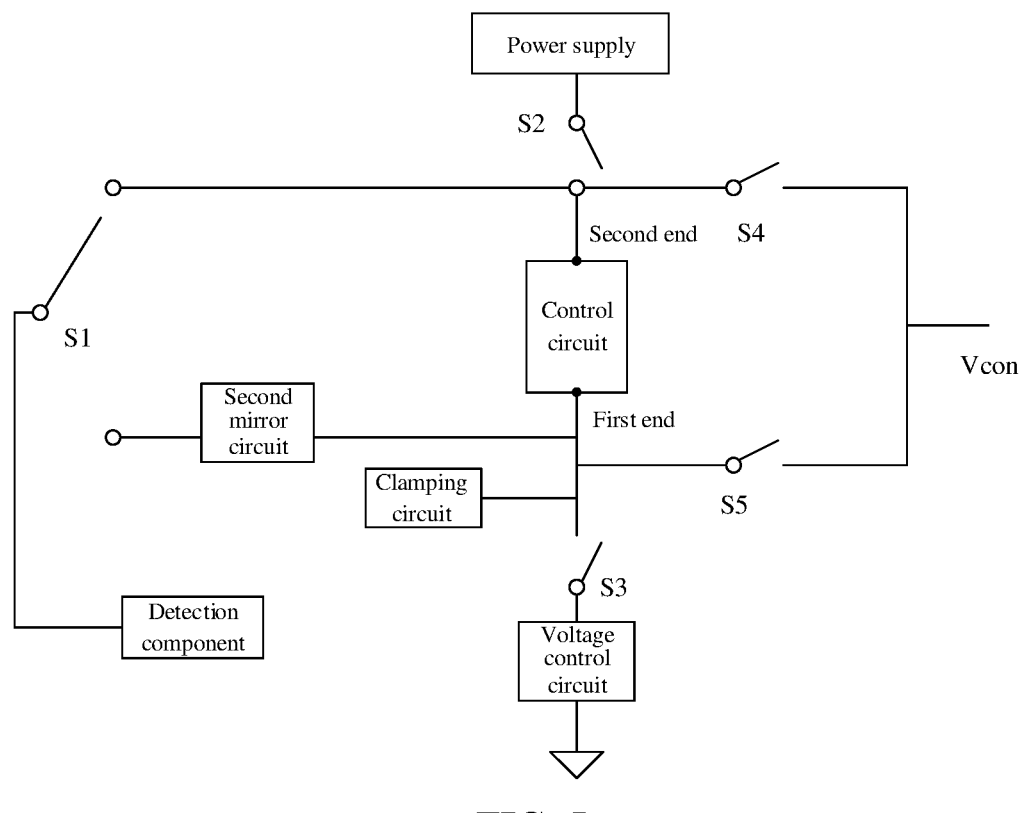
FIG. 5 is a schematic structural diagram of a phase compensation circuit module and a power amplifier according to an exemplary embodiment.

In an embodiment of the disclosure, as shown in combination with FIG. 4 and FIG. 5, there is provided a power amplifier assembly, including a power amplifier and a phase compensation circuit module. The phase compensation circuit module is connected with an input end of the power amplifier, and may change on-resistance of the power amplifier to compensate a phase of the power amplifier according to change of the on-resistance.

In an embodiment, the on-resistance of the power amplifier is configured to decrease in response to a phase of an output signal of the power amplifier decreasing and increase in response to the phase of the output signal of the power amplifier increasing. For example, the increased or decreased on-resistance is configured to make a change curve of AM-PM of the output signal changed from an arc segment to a straight segment.

In an embodiment, the power amplifier may include a first transistor M1 and a second transistor M2. The first transistor M1 and the second transistor M2 form a stacked one-stage amplification transistor. An input end of the phase compensation circuit module is connected with a gate of the first transistor, and an output end of the phase compensation circuit module is connected with a gate of the second transistor. In the embodiment, each of the first transistor and the second transistor is a field-effect transistor (FET), and may also be a bipolar transistor in other embodiments, which is not limited here.

In an embodiment, a gate of the second transistor M2 is connected with a gate capacitor, and the phase compensation circuit module is connected with the gate of the second transistor M2 through the gate capacitor of the second transistor. When the phase compensation circuit module changes the on-resistance, an equivalent capacitance in a loop also changes, which changes a phase of the second transistor, thereby compensating phase-distorted AM-PM.

In an embodiment, the power amplifier assembly may further include a first bias circuit and a second bias circuit. The first bias circuit is connected with the first transistor M1, and is configured to provide a bias current or voltage to the first transistor M1. The second bias circuit is connected with the second transistor M2, and is configured to provide a bias current or voltage to the second transistor M2.

In a specific embodiment, as shown in FIG. 5, the first bias circuit includes a bias current Ibias connected with the gate of the first transistor M1, and the second bias circuit includes a power supply Vg12 and a resistor R1, the power supply Vg12 is connected with the resistor R1, and the resistor R1 is connected with the gate of the second transistor M2, a gate capacitor Cgate is connected with the gate of the second transistor M2 and the resistor R1.

In an embodiment, the power amplifier assembly may further include an input matching circuit, so that the power amplifier may obtain maximum power from a signal input end. In a specific embodiment, as shown in FIG. 5, L1 and C1 form the input matching circuit, of which impedance matches impedance of the first transistor and internal impedance of a signal source at the signal input end of the power amplifier.

In an embodiment, a first blocking capacitor Cb1 is also included between the input matching circuit and the signal input end RFin, and a second blocking capacitor is also included between a signal output end and a drain of the second transistor M2.

In an embodiment, the phase compensation circuit module may include a variable resistor 101, a detection component 102 and a control component 103.

The detection component 102 has a detection end connected with the signal input end of the power amplifier, and is configured to detect an input signal of the signal input end.

The control component 103 is connected with the detection component 102, and is configured to output a control signal according to the input signal detected by the detection component 102.

The variable resistor 101 is connected with an output end of the control component 103, and is configured to change resistance linked to the power amplifier 200 according to the control signal, the variable resistor 101 forms a loop of the power amplifier and is configured to form the on-resistance of the power amplifier, so as to compensate the phase of the power amplifier according to change of the resistance.

In an embodiment, the detection component is a detector which is configured to detect the input signal of the signal input end RFin. When the input signal exceeds a preset threshold, the compensation circuit module starts up. The control component outputs the control signal according to the input signal. The signal detected by the detection component may be at least one of a current signal, a voltage signal, or a power signal. For example, the signal detected is a current signal.

In an embodiment, the control signal is a control voltage Vcon which is configured to control resistance of a variable resistor Rgate by the voltage.

Figure 6:
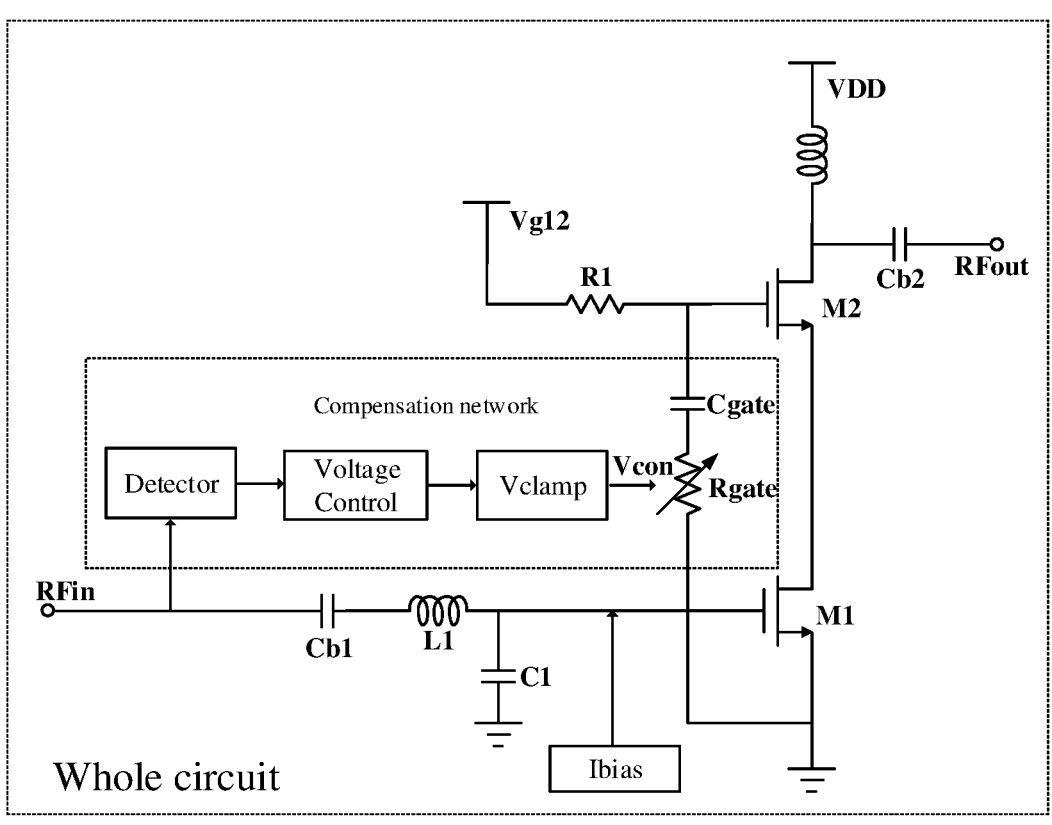
FIG. 6 is a schematic structural diagram of a phase compensation circuit module and a power amplifier according to an exemplary embodiment.

In an embodiment, the variable resistor Rgate is a voltage-controlled variable resistor, of which composition may refer to a circuit structure shown in FIG. 6.

In an embodiment, change of the resistance of the variable resistor is inversely proportional to the control voltage Vcon, and AM-PM is inversely proportional to change of the resistance of the variable resistor. Furthermore, as shown in combination with FIG. 7, a phase Phase of the gate of the second transistor M2, namely the phase of the output signal, is directly proportional to Vcon in a certain range, so that AM-PM is directly proportional to the control voltage Vcon.

In an embodiment, AM-PM may decrease or increase, thus the compensation circuit module is required to make the variable resistor decreased when AM-PM decreases, so as to make AM-PM increased, and to make the variable resistor increased when AM-PM increases, so as to make AM-PM decreased, to compensate AM-PM distortion.

Figure 8:
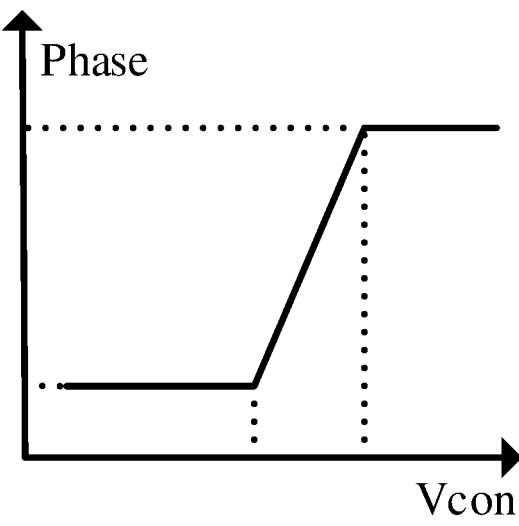
FIG. 8 is a schematic diagram of a relationship curve between a phase of a gate of a transistor M2 of a power amplifier and a control voltage Vcon according to an exemplary embodiment.

In an embodiment of the disclosure, as shown in combination with FIG. 8, it is an original state curve in case of increasing AM-PM, and after compensation of the compensation circuit module, that is, Vcon decreases after AM-PM increases, so that the on-resistance increases after AM-PM increases, thereby making AM-PM decreased, and making a change curve of AM-PM of the output signal changed from an arc segment to a straight segment.

Figure 9:
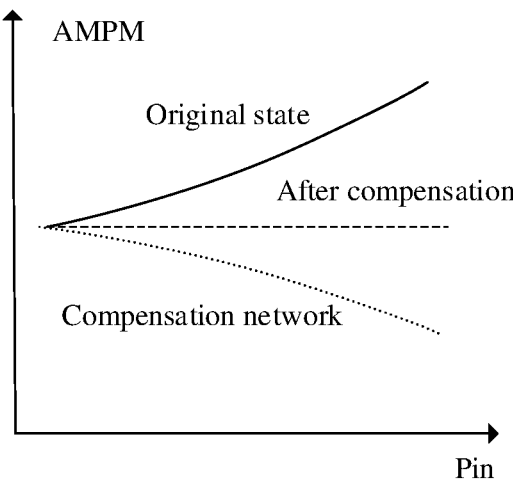
FIG. 9 is a schematic diagram of a change curve of compensation for AM-PM distortion according to an exemplary embodiment.

In an embodiment of the disclosure, as shown in combination with FIG. 9, it is an original state curve in case of decreasing AM-PM, and after compensation of the compensation circuit module, that is, Vcon increases after AM-PM decreases, so that the on-resistance decreases after AM-PM decreases, thereby making AM-PM increased, and making a change curve of AM-PM changed from an arc segment to a straight segment.

Compared with embodiments shown in FIG. 1, FIG. 2 and FIG. 3, a compensation circuit module is added in the embodiments of the disclosure, so that a gate capacitor originally grounded is connected with the variable resistor of the compensation circuit module to form a loop with the stacked transistors M1 and M2, and resistance of the variable resistor is adjusted by the compensation circuit module to implement compensation for AM-PM, thereby improving stability of AM-PM and linearity of the power amplifier.

In an embodiment, the control component may have a first path and a second path.

The control component switches to the first path and outputs a first control signal under a first condition, to perform first phase compensation on the power amplifier through the variable resistor.

The control component switches to the second path and outputs a second control signal under a second condition, to perform second phase compensation on the power amplifier through the variable resistor, the first phase compensation is in a direction opposite to the second phase compensation.

In an embodiment, the first condition and the second condition may refer to different modes, or different frequency bands, or other conditions. The first condition and the second condition may be preset.

In an embodiment, as shown in combination with FIG. 2 and FIG. 9, FIG. 9 is a phase (AM-PM) change curve after the first phase compensation is performed on the phase in FIG. 2.

As shown in FIG. 8, the phase curve in the original state tends to increase, the variable resistor is changed by outputting the first control signal, so that the change curve is pulled down by the first phase compensation when there is an increase trend, and then the phase change curve may tend to be straight.

Figure 10:
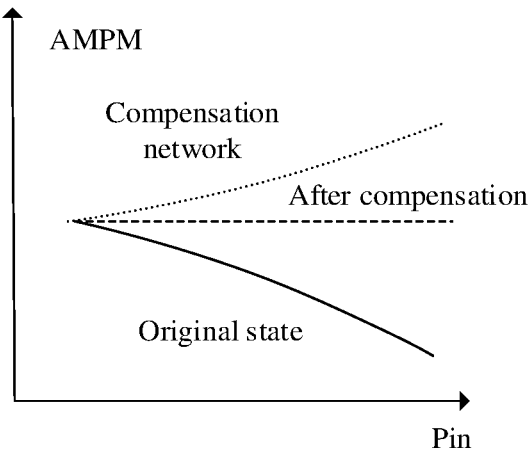
FIG. 10 is a schematic diagram of a change curve of compensation for AM-PM distortion according to an exemplary embodiment.

In an embodiment, as shown in combination with FIG. 3 and FIG. 10, FIG. 10 is a phase change curve after the second phase compensation is performed on the phase in FIG. 3.

As shown in FIG. 10, the phase curve in the original state tends to decrease, the variable resistor is changed by outputting the second control signal, so that the change curve is pulled up by the second phase compensation when there is a decrease trend, and then the phase change curve may tend to be straight.

It may be noted that the phase curve is in a straight segment when the input signal is input initially, this is because the input signal is small at this point and linearity of the power amplifier is good. When a large phase change occurs gradually, phase compensation may be performed through a path corresponding to the preset first or second condition.

In this way, different phase compensation may be triggered by setting different conditions.

As shown in combination with FIG. 5, in an embodiment, the control component may include a control circuit A first end of the control circuit is connected with the detection component and a second end of the control circuit is connected with the variable resistor in the first path, to output the first control signal.

The second end of the control circuit is connected with the detection component and the first end of the control circuit is connected with the variable resistor in the second path, to output the second control signal.

In an embodiment, change relationship between the first control signal and the input signal may be different from change relationship between the second control signal and the input signal.

In an embodiment, relationship between the input signal and the control signal may be controlled by setting a variable control resistor in the control circuit.

In this way, different phase compensation for the phase may be implemented by outputting control signals in different relationships through different paths.

Figure 7:
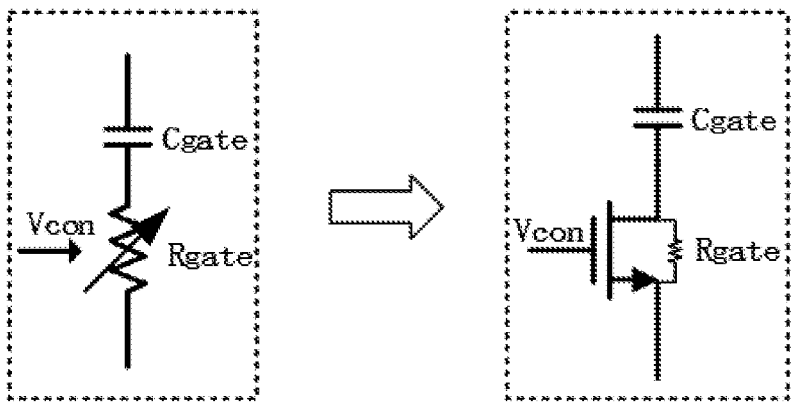
FIG. 7 is a schematic structural diagram of a variable resistor of a phase compensation circuit module according to an exemplary embodiment.

As shown in combination with FIG. 5, FIG. 6 and FIG. 7, in an embodiment, the control signal may be negatively or positively correlated with the input signal.

In an embodiment, the control circuit includes at least multiple control resistors R1, R2, R3 and R4 that may vary with the input signal, and each control resistor is connected in parallel with a source and drain of a transistor. Therefore, when any transistor is switched on, a control resistor connected in parallel with it is short-circuited, and then a total resistance of the control circuit may be reduced. On the contrary, when any transistor is switched off, a control resistor connected in parallel with it is switched on, and then the total resistance of the control circuit may be increased.

In an embodiment, the first control signal in the first path is negatively correlated with the input signal.

In an embodiment, the second control signal in the second path is positively correlated with the input signal.

In an embodiment, the first control signal is negatively correlated with the input signal, by establishing an inversely proportional relationship between the input signal and the total resistance.

In an embodiment, the second control signal is positively correlated with the input signal, by establishing a directly proportional relationship between the input signal and the total resistance.

In an embodiment, a total resistance Req of the control circuit may change step-by-step, and the total resistance Req may have a larger value when more phases are required to be compensated. Specifically, the total resistance Req has a smaller value when more control resistors are short-circuited. The total resistance Req has a larger value when more control resistors are switched on.

In an embodiment, the control resistors R1, R2, R3 and R4 are used to adjust a change slope of the phase.

In this way, the control signal positively or inversely correlated with the input signal may be output.

As shown in combination with FIG. 5, FIG. 6 and FIG. 7, in an embodiment, the first path may further include a second current mirror, a clamping circuit and a power supply.

The second current mirror has an input end connected with the detection component and an output end connected with the first end of the control circuit.

The clamping circuit is connected with the first end of the control circuit.

The power supply is connected with the second end of the control circuit.

The second path may further include a voltage control circuit.

The voltage control circuit has one end connected with the first end of the control circuit and another end grounded.

In an embodiment, the power supply is Vref and connected with a transistor. In response to CTRL_Fall_N=1, the transistor is switched on and connected with a second end VRA3 of the control circuit through a voltage output end VRA1, and is configured to provide an upper limit voltage Vref to the control circuit.

In an embodiment, the second current mirror is connected with the first end of the control circuit, both a first current mirror and the second current mirror may be configured to mirror a current k1*Iout proportional to the input signal to the control circuit, here k1 is a proportionality coefficient taking value of a positive number.

In an embodiment, the second current mirror includes Q7 and Q8 arranged in mirror symmetry.

In an embodiment, the clamping circuit provides a clamping voltage to the variable resistor in the first path. When the variable resistor in the control circuit becomes larger and larger, resulting in reduction of a possibly output first control signal, the clamping voltage may be output as the first control signal.

In this way, the first phase compensation may be implemented by controlling the variable resistor Rgate through the first control signal output by the first path.

In an embodiment, the voltage control circuit includes a transistor Q19. Transistors Q17 and Q18 are equivalent to a switch, the transistor Q19 is grounded or not grounded through the transistors Q17 and Q18.

In this way, the control circuit may be grounded when the second path is switched on.

Figure 11:
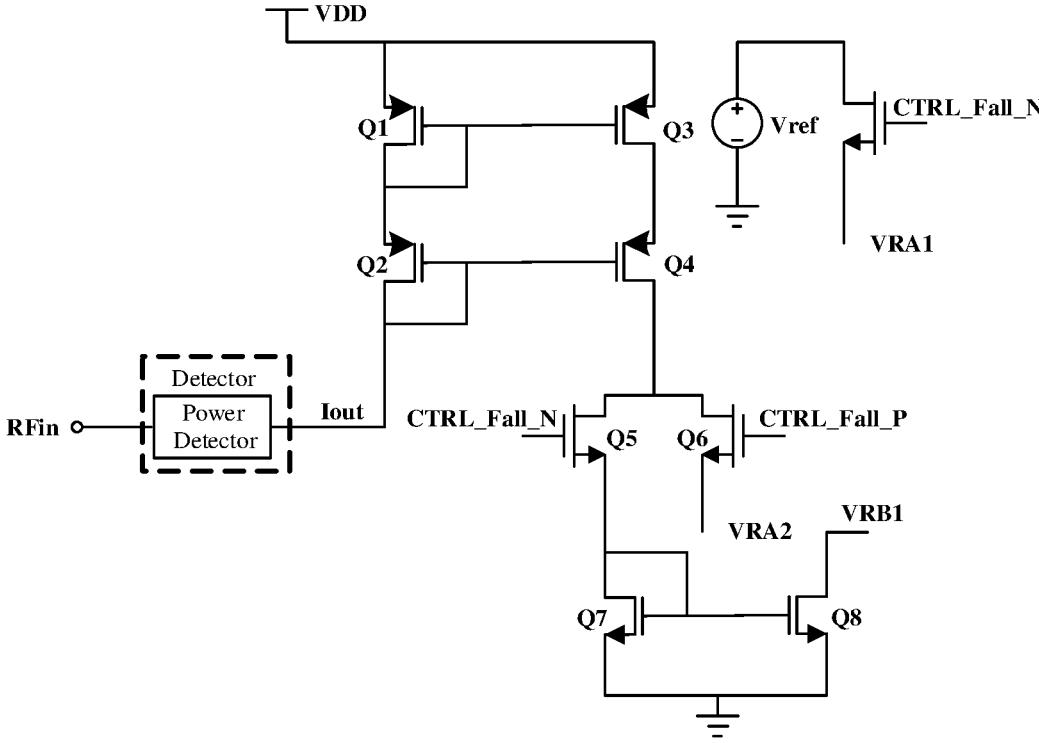
FIG. 11 is a partially enlarged diagram of a phase compensation circuit module according to an exemplary embodiment.
Figure 12:
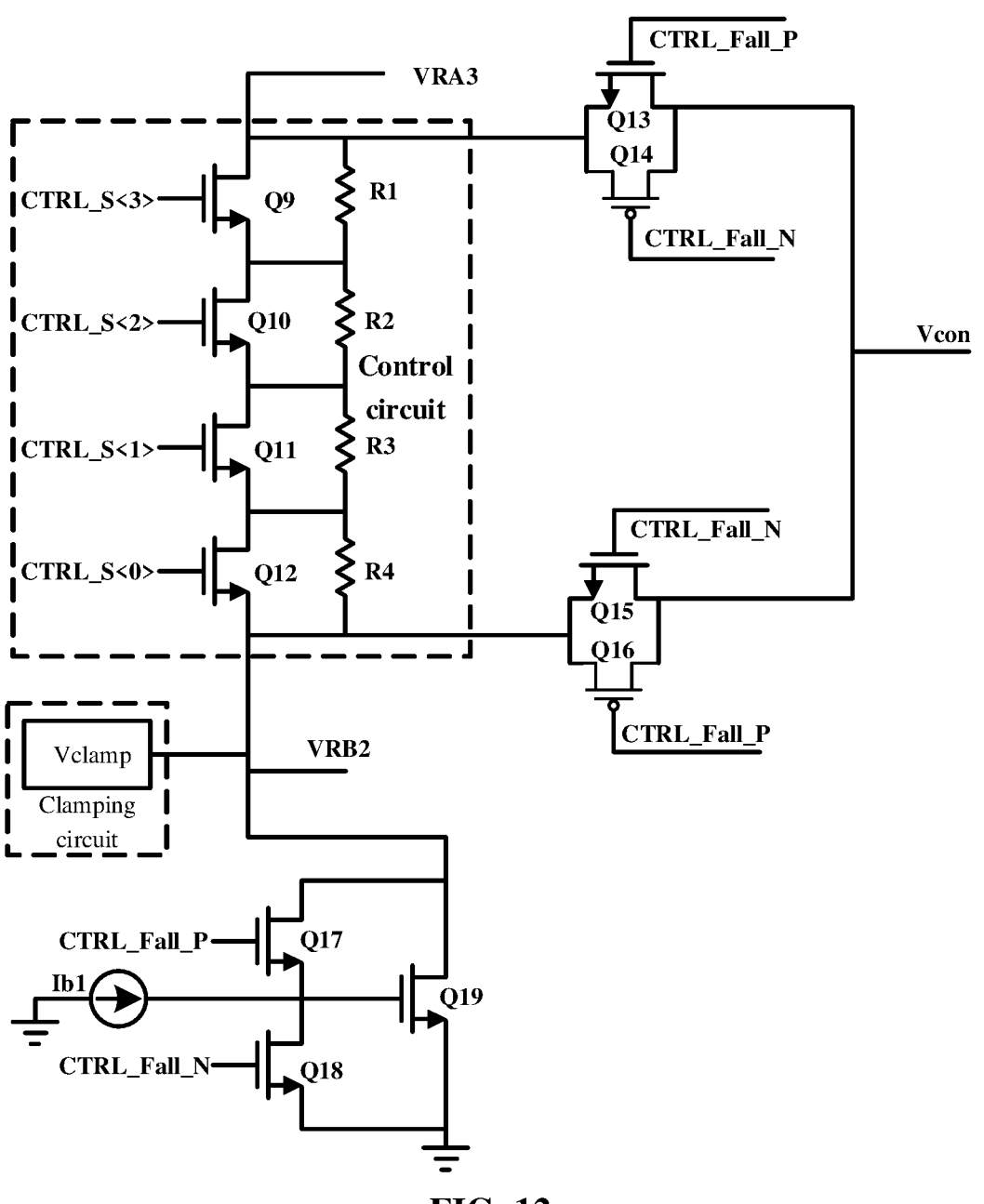
FIG. 12 is a partially enlarged diagram of a phase compensation circuit module according to an exemplary embodiment.

As shown in combination with FIG. 5, FIG. 11 and FIG. 12, in an embodiment, the control component may further include at least one of a first switch S1, a second switch S2, a third switch S3, a fourth switch S4, or a fifth switch S5.

The first switch S1 has one end connected with the detection component, and another end connected with the input end of the second current mirror in the first path and connected with the second end of the control circuit in the second path.

The second switch S2 has one end connected with the power supply and another end connected with the second end of the control circuit, switches on the control circuit and the power supply in response to the first path being switched on, and is switched off in response to the second path being switched on.

The third switch S3 has one end connected with the first end of the control circuit and another end connected with a first voltage control circuit, is switched off in response to the first path being switched on, and is grounded in response to the second path being switched on.

The fourth switch S4 has one end connected with the second end of the control circuit and another end connected with the output end of the control component, is switched off in response to the first path being switched on, and is switched on in response to the second path being switched on.

The fifth switch S5 has one end connected with the first end of the control circuit and another end connected with the output end of the control component, is switched on in response to the first path being switched on, and is switched off in response to the second path being switched on.

In an embodiment, the first switch S1 may be a single-pole double-throw switch. When the first switch S1 switches on the second current mirror and the detection component, an input signal of the detection component may be transmitted to a second mirror circuit.

In an embodiment, when the first switch S1 switches on the detection component and the control circuit, the input signal of the detection component may be transmitted to the second end of the control circuit.

In an embodiment, in order to switch on the first path, the following conditions are required to be satisfied simultaneously: the first switch S1 switches on the detection component and the second mirror circuit, the second switch S2 is switched on, the third switch S3 is switched off, the fourth switch S4 is switched off, and the fifth switch S5 is switched on, so that the input signal is transmitted to the second mirror circuit through the detection component. The input signal passing through the first end of the control circuit is affected by the power supply and the control circuit or the clamping circuit, and the first control signal is obtained. Then the first control signal is output through the fifth switch.

In an embodiment, in order to switch on the second path, the following conditions are required to be satisfied simultaneously: the first switch S1 switches on the detection component and the second end of the control circuit, the second switch S2 is switched off, the third switch S3 is switched on, the fourth switch S4 is switched on, and the fifth switch S5 is switched off, so that the input signal is transmitted to the second end of the control circuit through the detection component. The input signal is affected by the control circuit and the clamping circuit, and the second control signal is obtained. Then the second control signal is output through the fifth switch.

In an embodiment, the first switch S1 may include transistors Q5 and Q6. When Q5 is switched on, Q5 is connected with the input end of the second current mirror in the first path. When Q6 is switched on, Q6 is connected with the second end of the control circuit in the second path.

In an embodiment, the module may further include a sampling processing circuit.

The sampling processing circuit includes a first current mirror.

In an embodiment, the first current mirror includes Complementary Metal-Oxide-Semiconductor (CMOS) transistors Q1, Q2, Q3 and Q4 arranged in mirror symmetry. A gate and source of the transistor Q1 are connected to a gate of the transistor Q3, and are arranged in mirror symmetry. A gate and source of the transistor Q2 are connected to a gate of the transistor Q4, and are arranged in mirror symmetry. A drain of the transistor Q2 is connected to the gate and source of the transistor Q1. A drain of the transistor Q4 is connected to a source of the transistor Q3.

In an embodiment, the source of the transistor Q2 is connected to an output end of the detection component. The power supply VDD is connected to drains of the transistors Q1 and Q3, and is configured to provide a voltage source to the first current mirror. The input signal Iout is mirrored to the transistors Q3 and Q4 through the transistors Q1 and Q2. The gate and source of the transistor Q4 are connected to one end of the first switch. Or, the input signal Iout is mirrored to the transistor Q5 or the transistor Q6.

In this way, the first current mirror may make the input signal input to the control circuit more stable.

In an embodiment, the control component may have a first path. The first path includes a second current mirror, a control circuit, a clamping circuit and a power supply.

The second current mirror has an input end connected with the detection component.

The control circuit has a first end connected with an output end of the second current mirror and a second end connected with the variable resistor, to output a first control signal.

The clamping circuit is connected with the first end of the control circuit.

The power supply is connected with the second end of the control circuit.

In an embodiment, the power supply is Vref and is connected with a transistor. In response to the second switch being switched on, the end VRA1 of the detection component transistor is connected with the second end VRA3 of the control circuit, and is configured to provide an upper limit voltage Vref to the control circuit.

In an embodiment, the power supply provides an initial voltage Vref to the first control signal.

In an embodiment, formulas of calculating a first control signal Vcon output by the first path are as follows:

$$Vcon=Vref-k1*Iout*Req \ (Vcon>Vclamp) \qquad \text{Formula 1.1}$$

$$Vcon=Vclamp \ (Vcon<Vclamp) \qquad \text{Formula 1.2.}$$

In formulas 1.1 and 1.2, Vref is a preset DC feeding voltage as an initial voltage of Vcon, k1 represents a proportion of change of Iout after passing through a mirror current source of the second current mirror, Req represents a changing equivalent resistance of the control circuit, and Vclamp represents a preset voltage value of the clamping circuit.

In an embodiment, formula 1.1 indicates that the first control signal Vcon is inversely proportional to the input signal Iout. When the input signal increases, a change curve of AM-PM distortion is the change curve shown in FIG. 2 or FIG. 9, then phase compensation is implemented by controlling the first control signal Vcon to be inversely proportional to the input signal Iout.

In a specific implementation, resistance of the variable resistor is controlled to increase with the increase of AM-PM. The increased variable resistance may play a role of compensation as shown in FIG. 9, that is, the original state curve that tends to change upward when it is not compensated is pulled down after a signal is input to a first end VRB2 of the control circuit and then a variable resistance is increased, so that the curve tends to be a straight segment.

In an embodiment, the control component may have a second path. The second path includes a control circuit and a voltage control circuit.

The control circuit has a second end connected with the detection component and a first end connected with the variable resistor, to output a second control signal.

The voltage control circuit has one end connected with the first end of the control circuit and another end grounded.

In an embodiment, when the second path is switched on, a formula of calculating the second control signal is as follows:

$$Vcon=k1*Iout*Req+VRB2 \ (Vcon<Vpk) \qquad \text{Formula 1.3}$$

$$Vcon=Vpk \ (Vcon>Vpk) \qquad \text{Formula 1.4.}$$

In formulas 1.3, k1 represents a proportion of change of Iout after passing through a current source, Req represents an equivalent resistance of the control circuit, VRB2 represents a voltage value at a drain node of Q17, and Vpk represents a preset voltage value of the clamping circuit of the voltage Vcon.

In the embodiment of the disclosure, k1 is a proportion of the first current mirror, which is positive number.

In an embodiment, as shown in combination with FIG. 10, formula 1.4 indicates that a first voltage value Vpk provided by the clamping circuit is the maximum voltage value. In order to prevent the control voltage from being higher than a preset value, a transistor of a first sub-control component may enter a nonlinear area, and in this case, a directly proportional relationship between the control voltage value Vcon and the input signal Iout will not change in a linear proportion any more. Therefore, setting of the clamping circuit may make the transistor enter the nonlinear area, resulting in that AM-PM distortion cannot be compensated effectively due to impossibility of outputting a linearly changing voltage effectively.

In the embodiment of the disclosure, formula 1.3 indicates that the control voltage value Vcon is directly proportional to the input signal. When the input signal increases, resistance of the variable resistor is controlled to decrease with the decrease of AM-PM. The decreased variable resistance may play a role of compensation as shown in FIG. 10, that is, the original state curve that tends to change downward when it is not compensated is pulled up after the control signal is input from the second end VRA3 of the control circuit and then a variable resistance is increased, so that the curve tends to be a straight segment.

In an embodiment, the control circuit may include multiple sub-control circuits successively connected in series end-to-end.

One of the multiple sub-control circuits includes a transistor and a control resistor, a source and drain of the transistor are connected in parallel with two ends of the control resistor, here the source of the transistor is connected with one end, facing a first control voltage switching transistor, of the control resistor, and the drain of the transistor is connected with another end, away from the first control voltage switching transistor, of the control resistor, a total resistance of the control circuit is equal to a sum of resistances of the multiple sub-control circuits, multiple control resistors in the control circuit are configured to adjust a change slope of a control voltage output by the control circuit and a change slope of the phase.

Figure 13:
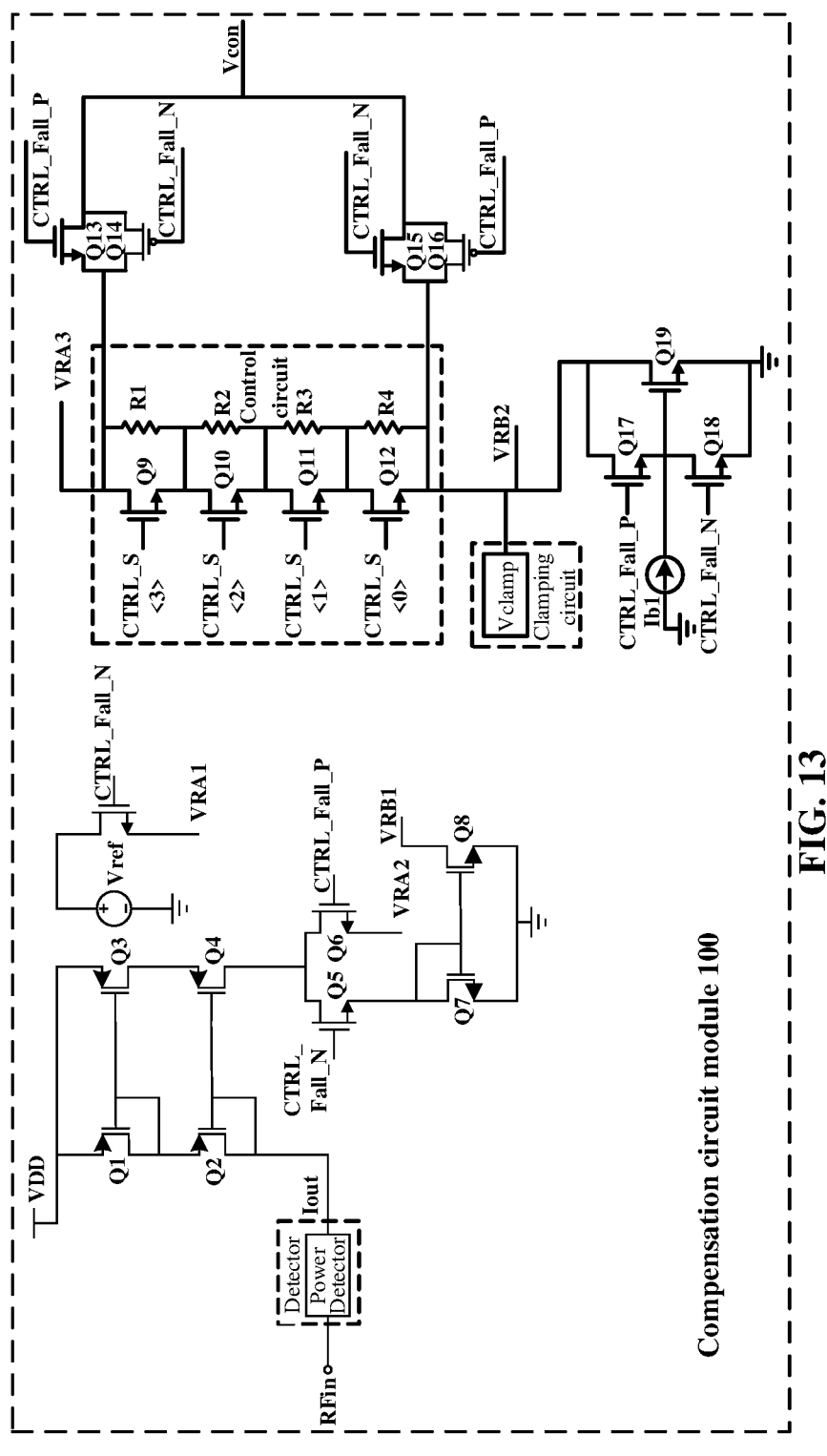
FIG. 13 is an overall structural diagram of a phase compensation circuit module according to an exemplary embodiment.

In an embodiment of the disclosure, as shown in combination with FIG. 12 and FIG. 13, a transistor Q9 and the control resistor R1 are connected in parallel to form a first sub-control circuit, a transistor Q10 and the control resistor R2 are connected in parallel to form a second sub-control circuit, a transistor Q11 and the control resistor R3 are connected in parallel to form a third sub-control circuit, and a transistor Q12 and the control resistor R4 are connected in parallel to form a fourth sub-control circuit.

In the embodiment of the disclosure, the number of sub-control circuits is not limited to 4, and may be set according to requirements.

In the embodiment of the disclosure, resistance of a sub-control circuit is related to whether the transistor thereof is switched on. When the transistor is switched on, the control resistor connected in parallel with the transistor is short-circuited, and resistance of the sub-control circuit is 0. When the transistor is switched off, the control resistor connected in parallel with the transistor is not short-circuited, and resistance of the sub-control circuit is resistance of the control resistor.

In the embodiment of the disclosure, the above circuit structure of the control circuit may implement stepping change of resistance of the control circuit, that is, each time a transistor is switched on, resistance of the control circuit decreases. When transistors are switched on successively, resistance of the control circuit decreases successively. Each time a transistor is switched off, resistance of the control circuit increases. When transistors are switched off successively, resistance of the control circuit increases successively.

In the embodiment of the disclosure, a function proportion relationship between the input signal RFin and Vcon may be adjusted flexibly by the control circuit, to achieve controllable stepping change of Vcon. Four control signals CTRL_S<0>, CTRL_S<1>, CTRL_S<2> and CTRL_S<3> control the resistors R1 to R4 to be switched on or off. Control logic of the equivalent resistance Req thereof to CTRL_S is shown in a comparison diagram of equivalent resistance of a stepping circuit in a control component of a phase compensation circuit module in FIG. 15. A voltage Vout is obtained by multiplying the equivalent resistance Req with a current flowing through the equivalent resistance Req, Vout=k1*Iout*Req, and then the proportional relationship between the input signal Iout and the control voltage Vcon may be changed.

In an embodiment of the disclosure, as shown in FIG. 17, it is a schematic diagram showing change of slope of Iout to Vout when the signal CTRL_S changes as shown in table and Req1>Req2>Req3 is obtained.

In an embodiment of the disclosure, as shown in FIG. 18, it shows influence of corresponding change of the equivalent resistance Req on AM-PM of the circuit.

In the embodiment of the disclosure, the above design of control circuit may flexibly control change of the input signal Iout and the voltage Vout, and then change the proportional relationship between the input signal Iout and the control voltage Vcon.

In the embodiments of the disclosure, programmable adjustment of AM-PM may be implemented by adjusting compensation parameters of the circuit through external logic controllers (such as Central Processing Unit (CPU) of a controller or a single chip microcomputer) and/or smart terminals (such as a smart phone or computer). The phase compensation circuit module and the power amplifier may be integrated in a chip, which has low cost and less resource occupation, and may improve a linearity index of the power amplifier. For example, a corresponding transistor is controlled to be switched on or off, by controlling each of the above logic gate switches CTRL_S<0>, CTRL_S<1>, CTRL_S<2>, CTRL_S<3>, CTRAL_Fall_P, and CTRAL_Fall_N to take value of 0 or 1, so as to implement compensation for AM-PM of the power amplifier by the phase compensation circuit module.

In an embodiment, there is provided a power amplification assembly, including a power amplifier and the phase compensation circuit module described in any of the above embodiments. The power amplifier includes at least a signal input end, a signal output end, an amplification transistor arranged between the signal input end and the signal output end, and a capacitor connected with the amplification transistor.

The variable resistor has a first end connected with the capacitor and a second end connected with the transistor, and is configured to change resistance linked to the power amplifier according to the control signal, to compensate a phase of the power amplifier.

In an embodiment, the capacitor Cgate connected with the transistor is a gate capacitor which is connected with a gate of the transistor M2. Transistors M1 and M2 form a stacked two-stage amplification transistor.

In an embodiment, the first bias circuit includes a power supply Vg12 and a resistor R1, and the second bias circuit includes a bias current Ibias.

In an embodiment, the first bias circuit is connected with the first transistor M1, and is configured to provide a bias current to the first transistor M1. The second bias circuit is connected with the second transistor M2, and is configured to provide a bias current to the second transistor M2.

In an embodiment, as shown in combination with FIG. 6, the first bias circuit includes the power supply Vg12 and the resistor R1, and the second bias circuit includes the bias current Ibias.

In an embodiment, the variable resistor Rgate is a voltage-controlled variable resistor, of which composition may refer to a circuit structure shown in FIG. 7.

In an embodiment, as shown in FIGS. 6, L1 and C1 form a matching circuit. A blocking capacitor is further included between the matching circuit and the signal input end RFin.

In an embodiment, the detection component is a detector which is configured to detect amplitude of change of the input signal of the signal input end RFin. In response to amplitude of the input signal exceeding a preset threshold, the compensation circuit module starts up. The control component outputs the control signal according to the input signal.

In an embodiment, the control signal is a control voltage Vcon which is configured to control resistance of the variable resistor Rgate by the voltage.

In an embodiment, the gate capacitor Cgate, the variable resistor Rgate, the first transistor M1 and the second transistor M2 form a loop. In case that resistance of the variable resistor Rgate changes, on-resistance in the loop changes, and then an equivalent capacitance in the loop also changes, which results in change of a phase of the second transistor, and further results in change of an AM-PM value.

In an embodiment, the variable resistor is inversely proportional to the control voltage Vcon, and AM-PM is inversely proportional to the variable resistor. Furthermore, as shown in combination with FIG. 8, a phase Phase of the gate of the second transistor M2 is directly proportional to Vcon in a certain range, so that AM-PM is directly proportional to the control voltage Vcon.

In an embodiment, AM-PM may decrease or increase, thus the compensation circuit module is required to make the variable resistor decreased when AM-PM decreases, so as to make AM-PM increased, and to make the variable resistor decreased when AM-PM increases, so as to make AM-PM decreased, to compensate AM-PM distortion.

In an embodiment, as shown in combination with FIG. 9, it is an original state curve in case of increasing AM-PM, and after compensation of the compensation circuit module, that is, Vcon decreases after AM-PM increases, so that the on-resistance increases after AM-PM increases, thereby making AM-PM decreased, and making a change curve of AM-PM changed from an arc segment to a straight segment.

In an embodiment, as shown in combination with FIG. 10, it is an original state curve in case of decreasing AM-PM, and after compensation of the compensation circuit module, that is, Vcon increases after AM-PM decreases, so that the on-resistance decreases after AM-PM decreases, thereby making AM-PM increased, and making a change curve of AM-PM changed from an arc segment to a straight segment.

Compared with existing FIG. 1, FIG. 2 and FIG. 3, a compensation circuit module is added in an embodiment, so that a gate capacitor originally grounded is connected with the variable resistor of the compensation circuit module to form a loop with the stacked transistors M1 and M2, and resistance of the variable resistor is adjusted by the compensation circuit module to implement compensation for AM-PM, thereby improving stability of AM-PM and linearity of the power amplifier. Furthermore, different compensation circuits are selected by switches, thus adjustability is good.

In an embodiment, programmable adjustment of AM-PM may be implemented by adjusting compensation parameters of the circuit through external logic controllers (such as CPU of a controller or a single chip microcomputer) and/or smart terminals (such as a smart phone or computer). The phase compensation circuit module and the power amplifier may be integrated in a chip, which has low cost and less resource occupation, and may improve a linearity index of the power amplifier.

In an embodiment, there is provided a compensation method, compensating the phase of the output signal of the above power amplifier by using the phase compensation circuit module provided in the above embodiments.

The method includes the following operations.

The input signal of the signal input end is detected by the detection component. The control signal is output by the control component, according to the input signal detected by the detection component, here the control signal is configured to change resistance linked to the power amplifier, and the variable resistor forms a loop of the power amplifier and is configured to change the resistance linked to the power amplifier according to the control signal, to compensate the phase of the power amplifier.

In an embodiment, programmable adjustment of AM-PM may be implemented by adjusting compensation parameters of the circuit through external logic controllers (such as CPU of a controller or a single chip microcomputer) and/or smart terminals (such as a smart phone or computer). The phase compensation circuit module and the power amplifier may be integrated in a chip, which has low cost and less resource occupation, and may improve a linearity index of the power amplifier.

In an embodiment, the method may further include the following operations.

It is switched to the first path of the control component and the first control signal is output under the first condition, to perform first phase compensation on the power amplifier through the variable resistor.

It is switched to the second path of the control component and the second control signal is output under the second condition, to perform second phase compensation on the power amplifier through the variable resistor, the first phase compensation is in a direction opposite to the second phase compensation.

In an embodiment, the method may further include the following operations.

The first control signal is output by the control circuit of the control component in the first path.

The second control signal is output by the control circuit of the control component in the second path.

In an embodiment, the control signal may be negatively or positively correlated with the input signal.

In an embodiment, the method may further include the following operations.

In response to the first path being switched on: a stable input signal is transmitted by the second current mirror to the first end of the control circuit; a clamping voltage is input by the clamping circuit to the control circuit; and an upper limit voltage is input by the power supply to the second end of the control circuit.

In response to the second path being switched on: the first end of the control circuit is grounded by the voltage control circuit.

In an embodiment, the method may further include the following operations.

The detection component and the input end of the second current mirror are switched on in response to the first switch being in the first path, and the detection component and the second end of the control circuit are switched on in response to the first switch being in the second path.

The second end of the control circuit and the power supply are switched on in response to the second switch being in the first path, and the second end of the control circuit and the power supply are switched off in response to the second switch being in the second path.

The third switch is grounded in response to the first path being switched on, and the third switch is switched off in response to the second path being switched on.

The control signal is output by the fourth switch to the variable resistor in response to the second path being switched on.

The control signal is output by the fifth switch to the variable resistor in response to the first path being switched on.

In an embodiment, the method may further include the following operations.

A voltage of an input power supply is transmitted by a first transistor and a fixed resistor of a second voltage control circuit to one end of the first switch.

In an embodiment, the method may further include the following operations.

A change slope of a control voltage output by the control circuit and a change slope of the phase are adjusted by multiple control resistors in the control circuit.

In an embodiment, there is provided a phase compensation circuit module, which may be the phase compensation circuit module in any of the above embodiments and elaboration thereof may not be repeated here.

In an embodiment of the disclosure, there is provided a compensation method, compensating the phase of the output signal of the above power amplifier by using the phase compensation circuit module provided in the above embodiments. The method includes the following operations. The input signal of the signal input end is detected by the detection component.

The control signal is output by the control component, according to the input signal detected by the detection component, here the control signal is configured to change resistance linked to the power amplifier, and the variable resistor forms a loop of the power amplifier and is configured to form on-resistance of the transistor of the power amplifier. The on-resistance of the transistor is configured to decrease in response to a phase of an output signal of the power amplifier decreasing and increase in response to the phase of the output signal of the power amplifier increasing. The increased or decreased on-resistance is configured to make a change curve of phase of the output signal changed from an arc segment to a straight segment.

In the embodiment of the disclosure, programmable adjustment of AM-PM may be implemented by adjusting compensation parameters of the circuit through external logic controllers (such as CPU of a controller or a single chip microcomputer) and/or smart terminals (such as a smart phone or computer). The phase compensation circuit module and the power amplifier may be integrated in a chip, which has low cost and less resource occupation, and may improve a linearity index of the power amplifier.

In the embodiment of the disclosure, the method may further include the following operations.

A control voltage which is directly or inversely proportional to the input signal is output by a first sub-control component according to the input signal.

An output voltage value range of the control voltage is limited by a second sub-control component.

In the embodiment of the disclosure, the method may further include the following operations.

The input signal is mirrored to a first switch transistor by a first current mirror.

A second current mirror is controlled to be switched on by the first switch transistor.

A current which is proportional to the input signal is mirrored to the control circuit by the second current mirror.

An upper limit voltage is provided by the power supply to the control circuit. The control circuit is configured to provide variable resistance according to a preset compensation.

An output voltage is controlled by a first control voltage switch transistor. A value of the control voltage is obtained by subtracting, from a value of the upper limit voltage, product of a value of a current which is proportional to the input signal and resistance of the control circuit.

In the embodiment of the disclosure, the method may further include the following operations.

The first current mirror is controlled to mirror the input signal to the control circuit through a second switch transistor. A voltage value of the second control voltage switch transistor is a sum of a voltage value provided by the power supply and a voltage value of the control circuit.

In the embodiment of the disclosure, the method may further include the following operations.

A first voltage value or a second voltage value of the control voltage is output by the second sub-control component according to the value of the control voltage.

When the control voltage is directly proportional to the input signal and the control voltage is greater than a maximum preset threshold, the second sub-control component outputs the first voltage value of the control voltage.

When the control voltage is inversely proportional to the input signal and the control voltage is less than a minimum preset threshold, the second sub-control component outputs the second voltage value of the control voltage.

The second voltage value is less than the first voltage value.

In an embodiment of the disclosure, there is provided a compensation circuit module, which is a compensation circuit for AM-PM of a radio frequency (RF) power amplifier based on Cgate.

In the embodiments of the disclosure, in a modern mobile communication system, performance indexes (such as power, efficiency, linearity, or the like) of a RF front-end power amplifier have an important impact on the whole system. Requirements on a transmission rate by the communication system increase continuously, which brings complexity of signal modulation modes, and further puts forward higher requirements on a linearity index of the power amplifier. In a system without memory effects, the linearity index of the power amplifier may be characterized by Amplitude Modulation to Amplitude Modulation (AM-AM) distortion and AM-PM distortion of the power amplifier. Compared with AM-AM distortion, AM-PM distortion mainly refers to change of phase difference between an input signal and an output signal due to amplitude change of the signals, after the input signal enters the power amplifier. Due to existence of nonlinearity of the amplifier itself, nonlinearity of a transistor is increased with the increase of the input signal, which further deteriorates AM-PM, and then affects the overall linearity.

In the embodiments of the disclosure, during design of the amplifier, in order to keep AM-PM to be in a certain range of change, the power amplifier is required to operate at linear power as much as possible, to maintain requirements on linearity. However, this may also reduce efficiency of the power amplifier and increase power consumption of the whole amplifier. Therefore, in a practical design, it is usually necessary to make a compromise between the two aspects.

In the embodiments of the disclosure, in order to improve linearity of the system under the premise of maintaining a certain efficiency, it is necessary to reduce change rates of AM-AM and AM-PM by means of additional linearization techniques. Traditional linearization techniques include feedback method, feedforward method, Digital Predistortion (PDP) technique, or the like, which have a certain effect on improving AM-PM distortion of the power amplifier. However, these methods have some disadvantages such as strict conditions, high cost, more consumption of system resources, or the like.

In the embodiments of the disclosure, PDP technique is a method for improving the linearity of the power amplifier by compensating change of AM-AM and AM-PM. PDP technique extracts input and output characteristics of the power amplifier and constructs a power amplifier model, and constructs a corresponding linearization strategy based on the model. In order to correct various distortions, DPD system requires that a sampled signal is at least five times the original signal. A modern communication system is a broadband processing system. According to a sampling theorem, in order to acquire signals effectively, higher requirements are put on performance (such as sampling rate) of analog-to-digital and digital-to-analog converters, which increases cost and complexity of the system.

In the embodiments of the disclosure, a basic architecture of a conventional power amplifier is shown in FIG. 1. RFin and RFout are an input node and an output node, respectively. In the amplifier circuit, a compensation network, a stacked two-layer amplification transistor formed of M1 and M2, Ibias and Vg12 form a bias network. VDD provides a DC feeding network which is connected to a drain of the transistor through Choke1. Cb1 and Cb2 are blocking capacitors of input and output, respectively. L1 and C1 form an output matching network. With the increase of an input signal, nonlinearity of the power amplifier is enhanced, and distortion of the amplifier deteriorates. AM-PM distortion thereof has two change trends. As shown in FIG. 2, AM-PM curve may show an ascending trend with the increase of input power Pin. As shown in FIG. 3, AM-PM curve may also show a descending trend with the increase of input power. Without compensating the trend of AM-PM, a linearity index of the circuit may further deteriorate and cannot meet index requirements. A phase compensation method by means of anterior and posterior two-stage power amplifiers has poor adjustable performance as a whole and is difficult to cope with complex change of AM-PM.

An embodiment of the disclosure proposes an AM-PM compensation circuit based on capacitance adjustment of Cgate. Under a condition where a large signal is input in the circuit, AM-PM distortion is serious, resulting in a problem of deterioration of the linearity. As shown in FIG. 6, it is a block diagram of overall implementation of a power amplifier with an AM-AM compensation network. Compared with the conventional power amplifier in FIG. 1, a variable resistor Rgate is connected in series to a ground end of the original Cgate. In this way, the variable resistor Rgate changes with amplitude change of the input signal, function correspondences between RFin and Phase are established, then the whole AM-PM of the power amplifier is affected, and the overall adjustability is improved.

In the embodiment of the disclosure, the compensation circuit is formed of three parts as follows.

A first part includes the capacitor Cgate and the variable resistor Rgate connected in series with it. Change of Rgate may affect an equivalent capacitance of the stacked CMOS, thus changing phase change of the circuit.

A second part includes a detector which is configured to detect amplitude of change of the input signal. The detector may be a power detector shown in FIG. 11. In response to amplitude of the input signal exceeding a preset value, the compensation circuit starts up.

A third part includes a voltage control circuit which is configured to control resistance of the variable resistor R1 and a clamping circuit Vclamp added to control a range of change of the variable resistor.

In the embodiment of the disclosure, an operation principle of the circuit is explained as follows.

In case that amplitude of the input signal RFin exceeds the preset value, each of the power amplification transistors M1 and M2 enters a nonlinear area, and AM-PM of the circuit deteriorates. At this point, the detector in the compensation network detects an amplitude signal of the input signal and transmits it to the voltage control circuit. The variable resistor Rgate is generally replaced by a gate controlled Metal-Oxide-Semiconductor (MOS) transistor, as shown in FIG. 7. Vcon is used to control a gate voltage of a transistor Mc, thereby changing on-resistance of the MOS transistor, indirectly controlling an equivalent capacitance of Cgate and affecting phase change of the circuit. As shown in FIG. 8, change of Vcon will change the phase of the circuit, and a value of Vcon is limited by characteristics of the transistor Mc. When the voltage Vcon is too low, so that it is lower than a threshold voltage Vth of the transistor, then Ron is too high, thus it affects the phase of the output signal. Therefore, in order not to affect the overall phase of the output signal of the circuit, the output signal Vcon configured to control the variable resistor is required to be in a certain range of change, to have a good adjustment effect on AM-PM. Therefore, a clamping circuit Vclamp is added to limit amplitude range of Vcon, and then a Vcon signal is output to a control port of the variable resistor, to change resistance of Rgate, thus affecting the equivalent capacitance of Cgate, and then changing AM-PM of the circuit under a large signal. The increase of Vcon may make AM-PM of the circuit larger, and the decrease of Vcon may make AM-PM smaller.

Figure 14:
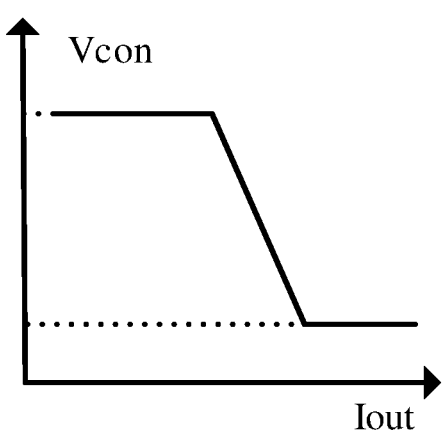
FIG. 14 is a schematic diagram of a relationship curve between a control voltage Vcon output by a control component of a phase compensation circuit module and an input signal Iout according to an exemplary embodiment.

In the embodiments of the disclosure, circuits in the compensation network are analyzed as above, with the increase of an input signal, nonlinearity of the power amplifier is enhanced, and AM-PM distortion thereof has two change trends: ascending and descending, thus a corresponding compensation network is required to achieve flexible switch with respect to the two cases. The compensation network controls change of AM-PM as shown in FIG. 9 and FIG. 10. This design implements the above control logic by means of switch. In case of CTRAL_Fall_P=1, the output voltage Vcon of the compensation network increases with the increase of the input signal, as shown in FIG. 15. In case of CTRAL_Fall_N=1, the output voltage Vcon of the compensation network decreases with the increase of the input signal, as shown in FIG. 14. FIG. 16 shows a comparison diagram of equivalent resistance of a stepping circuit in a control component of a phase compensation circuit module.

In the embodiments of the disclosure, a function proportion relationship between the input signal RFin and Vcon may be adjusted flexibly, to achieve controllable stepping change of Vcon. A stepping control circuit formed of Q9 to Q12 and R1 to R4 is added in front of an output node of Vcon in the circuit. As shown in FIG. 13, four control signals CTRL_S<0>, CTRL_S<1>, CTRL_S<2> and CTRL_S<3> control the resistors R1 to R4 to be switched on or off. Control logic of the equivalent resistance Req thereof to CTRL_S is shown in Table 1. A voltage Vout is obtained by multiplying the equivalent resistance Req with a current flowing through the equivalent resistance Req, and then the proportional relationship between Vcon and the output signal Iout of the detector circuit may be changed. As shown in FIG. 17, it is a schematic diagram showing change of slope of Iout to Vout when the signal CTRL_S changes as shown in Table 1 and Req1>Req2>Req3 is obtained. FIG. 18 shows influence of corresponding change of the equivalent resistance Req on AM-PM of the circuit.

In the embodiments of the disclosure, analysis is carried out in two cases, and the circuit is shown in FIG. 13.

In a first case, that is, CTRAL_Fall_N=1:

an output signal Iout of the detector reaches a drain of Q5 after passing through a mirror current source formed of Q1, Q2, Q3 and Q4, Q5 is switched on, Q6 is switched off, and after passing through a mirror current source formed of Q7 and Q8, so that a current signal is converted into a voltage signal at the terminal VRB, Q17 and Q19 are switched off, Q18 is switched on, a stepping control circuit formed of Q9 to Q12 and R1 to R4 controls a stepping value of the voltage, and is connected to an external clamping circuit to prevent the voltage from being lower than a preset value, and finally a signal Vcon is output by passing through switch transistors Q15 and Q16. The mathematical relationship is shown as below, and it may be concluded that as the input signal Iout becomes larger, the voltage of Vcon gradually becomes smaller, and a minimum value thereof is stable at Vclamp:

$$Vcon=Vref-k1*Iout*Req\ (Vcon>Vclamp)$$

$$Vcon=Vclamp\ (Vcon<Vclamp).$$

Vref is a preset DC feeding voltage as an initial voltage of Vcon, k1 represents a proportion of change of Iout after passing through a current source, Req represents a changing step generated by an equivalent resistance of the stepping control circuit, and Vclamp represents a preset voltage value of the clamping circuit.

In a second case, that is, CTRAL_Fall_P=1:

an output signal Iout of the detector reaches a drain of Q6 after passing through a mirror current source formed of Q1, Q2, Q3 and Q4, Q6 is switched on, Q5 is switched off, Q7 and Q8 are switched off, so that a current signal is converted into a voltage signal at the terminal VRA, Q17 and Q19 are switched on, Q18 is switched off, a stepping control circuit formed of Q9 to Q12 and R1 to R4 controls a stepping value of the voltage, and finally a signal Vcon is output by passing through switch transistors Q13 and Q14. The mathematical relationship is shown as below:

$$Vcon=k1*Iout*Req+VRB\ (Vcon<Vpk)$$

$$Vcon=Vpk\ (Vcon>Vpk).$$

k1 represents a proportion of change of Iout after passing through a current source, Req represents a changing step generated by an equivalent resistance of the stepping control circuit, VRB represents a voltage value at a drain node of Q17, and Vpk represents a maximum value of an upward amplitude of the voltage Vcon The compensation circuit has a relatively simple topology and is flexible in design. Programmable adjustment of AM-PM may be implemented by adjusting compensation parameters of the circuit, which is easy to be implemented. The circuit may be integrated in a chip, which has low cost and less resource occupation, may improve a linearity index of the power amplifier, and has excellent adjustability.

In an embodiment of the disclosure, there is provided a compensation device, including a processor and a memory.

The memory is configured to store instructions executable by the processor.

The processor is configured to implement operations of the above compensation methods, when executing a computer service It may be understood by those of ordinary skill in the art that all or part of the operations implementing the above method embodiments may be implemented by instructing related hardware through a program, the program may be stored in a computer-readable storage medium, and the program is executed to execute the operations of the above method embodiments. The abovementioned storage medium includes various media capable of storing program codes, such as a mobile storage device, a Read-Only Memory (ROM), a Random Access Memory (RAM), a magnetic disk, an optical disk, or the like.

In an embodiment of the disclosure, there is provided a storage medium, having stored thereon computer-executable instructions. The computer-executable instructions are executed by a processor to implement the operations of the above compensation method.

Or, when implemented in form of a software function module and sold or used as an independent product, the integrated unit of the embodiments of the disclosure may also be stored in a computer-readable storage medium. Based on such understanding, the technical solutions of the embodiments of the disclosure substantially or parts making contributions to some implementations may be embodied in form of a software product, and the computer software product is stored in a storage medium, including multiple instructions configured to enable a piece of computer equipment (which may be a personal computer, a server, a network device, or the like) to execute all or part of the methods of the embodiments of the disclosure. The abovementioned storage medium includes various media capable of storing program codes, such as a mobile storage device, a ROM, a RAM, a magnetic disk, an optical disk, or the like.

The above descriptions are only specific implementations of the disclosure, however, the scope of protection of the disclosure is not limited thereto. Any variations or replacements apparent to those skilled in the art within the technical scope disclosed by the disclosure shall fall within the scope of protection of the disclosure. Therefore, the scope of protection of the disclosure should be subject to the scope of protection of the application document.

The disclosure provides a phase compensation circuit module, a power amplification assembly, and a compensation method and device. The phase compensation circuit module includes at least a variable resistor, a detection component and a control component. The detection component has a detection end connected with a signal input end of a power amplifier, and is configured to detect an input signal of the signal input end. The control component is connected with the detection component, and is configured to output a control signal according to the input signal detected by the detection component. The variable resistor is connected with an output end of the control component, and is configured to change resistance linked to the power amplifier according to the control signal, the variable resistor forms a loop of the power amplifier and is configured to form on-resistance of a transistor of the power amplifier. The on-resistance of the transistor is configured to change in response to change of a phase of an output signal of the power amplifier changing, which implements compensation for AM-PM, improves linearity and adjustability.

What is claimed is:

1. A phase compensation circuit module, comprising:
   a detection component having a detection end connected with a signal input end of a power amplifier, and configured to detect an input signal of the signal input end;
   a control component connected with the detection component, and configured to output a control signal according to the input signal detected by the detection component; and
   a variable resistor connected with an output end of the control component, and configured to change resistance linked to the power amplifier according to the control signal, to compensate a phase of the power amplifier;
   wherein the control component has a first path and a second path,
      the control component switches to the first path and outputs a first control signal under a first condition, to perform first phase compensation on the power amplifier through the variable resistor,
      the control component switches to the second path and outputs a second control signal under a second condition, to perform second phase compensation on the power amplifier through the variable resistor, the first phase compensation is in a direction opposite to the second phase compensation.

2. The phase compensation circuit module of claim 1, wherein the control component comprises a control circuit,
   a first end of the control circuit is connected with the detection component and a second end of the control circuit is connected with the variable resistor in the first path, to output the first control signal,
   the second end of the control circuit is connected with the detection component and the first end of the control circuit is connected with the variable resistor in the second path, to output the second control signal.

3. The phase compensation circuit module of claim 1, wherein the control signal is negatively or positively correlated with the input signal.

4. The phase compensation circuit module of claim 2, wherein
   the first path further comprises:
      a second current mirror having an input end connected with the detection component and an output end connected with the first end of the control circuit;
      a clamping circuit connected with the first end of the control circuit; and
      a power supply connected with the second end of the control circuit, the second path further comprises:
      a voltage control circuit having one end connected with the first end of the control circuit and another end grounded.

5. The phase compensation circuit module of claim 4, wherein the control component further comprises at least one of:
   a first switch having one end connected with the detection component, and another end connected with the input end of the second current mirror in the first path and connected with the second end of the control circuit in the second path;
   a second switch having one end connected with the power supply and another end connected with the second end of the control circuit, switching on the control circuit and the power supply in response to the first path being switched on, and switched off in response to the second path being switched on;
   a third switch having one end connected with the first end of the control circuit and another end connected with a first voltage control circuit, switched off in response to the first path being switched on, and grounded in response to the second path being switched on;

a fourth switch having one end connected with the second end of the control circuit and another end connected with the output end of the control component, switched off in response to the first path being switched on, and switched on in response to the second path being switched on; or a fifth switch having one end connected with the first end of the control circuit and another end connected with the output end of the control component, switched on in response to the first path being switched on, and switched off in response to the second path being switched on.

6. The phase compensation circuit module of claim 2, further comprising:

a sampling processing circuit having an input end connected with the detection component to process a sampling signal obtained by the detection component, and an output end connected with the control circuit, the sampling processing circuit comprising a first current mirror.

7. The phase compensation circuit module of claim 2, wherein the control circuit comprises a plurality of sub-control circuits successively connected in series end-to-end, one of the plurality of sub-control circuits comprises a transistor and a control resistor, a source and drain of the transistor are connected in parallel with two ends of the control resistor, wherein the source of the transistor is connected with one end, facing a first control voltage switching transistor, of the control resistor, and the drain of the transistor is connected with another end, away from the first control voltage switching transistor, of the control resistor, a total resistance of the control circuit is equal to a sum of resistances of the plurality of sub-control circuits, a plurality of control resistors in the control circuit are configured to adjust a change slope of a control voltage output by the control circuit and a change slope of the phase.

8. A power amplification assembly comprising the phase compensation circuit module of claim 6, wherein the power amplifier further comprises:

a signal output end, an amplification transistor arranged between the signal input end and the signal output end, and a capacitor connected with the amplification transistor; and wherein the variable resistor has a first end connected with the capacitor and a second end connected with the amplification transistor, and is configured to change resistance linked to the power amplifier according to the control signal, to compensate a phase of the power amplifier.

9. The power amplification assembly of claim 8, wherein on-resistance of the power amplifier is configured to decrease in response to a phase of an output signal of the power amplifier decreasing and increase in response to the phase of the output signal of the power amplifier increasing.

10. A compensation method, compensating the phase of the output signal of the power amplifier of the power amplification assembly of claim 9, comprising:

detecting, by the detection component, the input signal of the signal input end; and outputting, by the control component, the control signal according to the input signal detected by the detection component, wherein the control signal is configured to change resistance linked to the power amplifier, and the variable resistor forms a loop of the power amplifier and is configured to change the resistance linked to the power amplifier according to the control signal, to compensate the phase of the power amplifier.

11. The compensation method of claim 10, comprising:

switching to the first path of the control component and outputting the first control signal under the first condition, to perform first phase compensation on the power amplifier through the variable resistor; and switching to the second path of the control component and outputting the second control signal under the second condition, to perform second phase compensation on the power amplifier through the variable resistor, the first phase compensation being in a direction opposite to the second phase compensation.

12. The compensation method of claim 10, wherein the first control signal is output by the control circuit of the control component in the first path, the second control signal is output by the control circuit of the control component in the second path.

13. The compensation method of claim 10, wherein the control signal is negatively or positively correlated with input signal.

14. The compensation method of claim 12, wherein in response to the first path being switched on:

the input signal is transmitted by the second current mirror to the first end of the control circuit;

a clamping voltage is input by the clamping circuit to the control circuit; and an upper limit voltage is input by the power supply to the second end of the control circuit, in response to the second path being switched on:

the first end of the control circuit is grounded by the voltage control circuit.

15. The compensation method of claim 14, wherein the detection component and the input end of the second current mirror are switched on in response to the first switch being in the first path, and the detection component and the second end of the control circuit are switched on in response to the first switch being in the second path, the second end of the control circuit and the power supply are switched on in response to the second switch being in the first path, and the second end of the control circuit and the power supply are switched off in response to the second switch being in the second path, the third switch is grounded in response to the first path being switched on, and the third switch are switched off in response to the second path being switched on, the control signal is output by the fourth switch to the variable resistor in response to the second path being switched on, and the control signal is output by the fifth switch to the variable resistor in response to the first path being switched on.

16. The compensation method of claim 10, wherein a voltage of an input power supply is transmitted by a first transistor and a fixed resistor of a second voltage control circuit to one end of the first switch.

17. A compensation device, comprising a processor connected with a memory, and configured to implement the method of claim 10 through computer-executable instructions of the memory.

18. A phase compensation circuit module, comprising:

a detection component having a detection end connected with a signal input end of a power amplifier, and configured to detect an input signal of the signal input end;

a control component connected with the detection component, and configured to output a control signal according to the input signal detected by the detection component; and a variable resistor connected with an output end of the control component, and configured to change resistance linked to the power amplifier according to the control signal, to compensate a phase of the power amplifier wherein the control component has a first path comprising:

a second current mirror having an input end connected with the detection component;

a control circuit having a first end connected with an output end of the second current mirror and a second end connected with the variable resistor, to output a first control signal;

a clamping circuit connected with the first end of the control circuit; and a power supply connected with the second end of the control circuit.

19. A phase compensation circuit module, comprising:

a detection component having a detection end connected with a signal input end of a power amplifier, and configured to detect an input signal of the signal input end;

a control component connected with the detection component, and configured to output a control signal according to the input signal detected by the detection component; and a variable resistor connected with an output end of the control component, and configured to change resistance linked to the power amplifier according to the control signal, to compensate a phase of the power amplifier wherein the control component has a second path comprising:

a control circuit having a second end connected with the detection component and a first end connected with the variable resistor, to output a second control signal; and a voltage control circuit having one end connected with the first end of the control circuit and another end grounded.

* * * * *